(12) United States Patent
Kanno

(10) Patent No.: US 9,607,703 B2
(45) Date of Patent: Mar. 28, 2017

(54) MEMORY SYSTEM

(71) Applicant: Kabushiki Kaisha Toshiba, Minato-ku, Tokyo (JP)

(72) Inventor: Shinichi Kanno, Ota Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 14/639,044

(22) Filed: Mar. 4, 2015

(65) Prior Publication Data

US 2016/0071607 A1    Mar. 10, 2016

Related U.S. Application Data

(60) Provisional application No. 62/047,299, filed on Sep. 8, 2014.

(51) Int. Cl.
| | |
|---|---|
| *H03M 13/43* | (2006.01) |
| *G11C 16/26* | (2006.01) |
| *H03M 13/05* | (2006.01) |
| *H03M 13/00* | (2006.01) |
| *G11C 16/04* | (2006.01) |
| *G11C 11/56* | (2006.01) |
| *G11C 16/10* | (2006.01) |

(52) U.S. Cl.
CPC .......... *G11C 16/26* (2013.01); *G11C 11/5642* (2013.01); *G11C 16/0483* (2013.01); *H03M 13/05* (2013.01); *H03M 13/611* (2013.01); *G11C 16/10* (2013.01)

(58) Field of Classification Search
CPC ..................................................... H03M 13/43

USPC ................................................. 714/760, 6.11
See application file for complete search history.

(56) References Cited

U.S. PATENT DOCUMENTS

| | | | |
|---|---|---|---|
| 5,909,449 A | 6/1999 | So et al. | |
| 6,462,988 B1 * | 10/2002 | Harari | G11C 11/5621 257/E21.209 |
| 6,487,701 B1 * | 11/2002 | Dean | G01R 31/2891 716/108 |
| 7,551,478 B2 | 6/2009 | Kanno | |
| 7,577,036 B2 | 8/2009 | Sarin et al. | |

(Continued)

FOREIGN PATENT DOCUMENTS

| | | |
|---|---|---|
| JP | 10-078853 A | 3/1998 |
| JP | 11-154394 A | 6/1999 |

(Continued)

*Primary Examiner* — Fritz Alphonse
(74) *Attorney, Agent, or Firm* — White & Case LLP

(57) ABSTRACT

According to one embodiment, a memory system includes a memory and a setting unit. The memory includes a memory cell array and a peripheral circuit. The memory cell array includes a plurality of memory cells, each of which holds an electrical charge. The peripheral circuit is configured to read a value from each memory cell by comparing a quantity of an electrical charge held in the memory cell with a determination threshold. The memory stores first data in the memory cell array. The first data include a plurality of values. The setting unit is configured to change the determination threshold according to the number of values which are different in second data and third data among the plurality of values. The second data are first data before being written to the memory. The third data are first data that have been read from the memory.

13 Claims, 7 Drawing Sheets

(56) References Cited

U.S. PATENT DOCUMENTS

| | | |
|---|---|---|
| 7,590,919 B2 | 9/2009 | Kanno |
| 7,961,516 B2 | 6/2011 | Isobe |
| 8,279,668 B2 | 10/2012 | Cho et al. |
| 2015/0178189 A1* | 6/2015 | Lasser ................ G06F 12/0246 714/6.11 |

FOREIGN PATENT DOCUMENTS

| | | |
|---|---|---|
| JP | 11-213682 A | 8/1999 |
| JP | 2001-332096 A | 11/2001 |
| JP | 2007-128577 A | 5/2007 |
| JP | 2007-157239 A | 6/2007 |
| JP | 2009-140564 A | 6/2009 |
| JP | 2010-526397 A | 7/2010 |
| JP | 2011-510428 A | 3/2011 |
| WO | 2004/070731 A1 | 8/2004 |
| WO | 2005/041107 A2 | 5/2005 |

* cited by examiner

MEMORY SYSTEM

CROSS-REFERENCE TO RELATED APPLICATIONS

This application is based upon and claims the benefit of priority from U.S. Provisional Application No. 62/047,299, filed on Sep. 8, 2014; the entire contents of which are incorporated herein by reference.

FIELD

Embodiments described herein relate generally to a memory system.

BACKGROUND

Conventionally, a semiconductor memory holding an electrical charge to store information according to the quantity of a held electrical charge is widely known. Information stored by the semiconductor memory is determined on the basis of comparison between a voltage according to the quantity of a held electrical charge and a read voltage which is set in advance. The quantity of a held electrical charge changes over time or on every access. A technique for shifting the read voltage according to the change of the quantity of a held electrical charge has been developed in order to prevent information from being lost because of the change in the quantity of a held electrical charge.

DETAILED DESCRIPTION

In general, according to one embodiment, a memory system includes a memory and a setting unit. The memory includes a memory cell array and a peripheral circuit. The memory cell array includes a plurality of memory cells, each of which holds an electrical charge. The peripheral circuit is configured to read a value from each memory cell by comparing a quantity of an electrical charge held in the memory cell with a determination threshold. The memory stores first data in the memory cell array. The first data include a plurality of values. The setting unit is configured to change the determination threshold according to the number of values which are different in second data and third data among the plurality of values. The second data are first data before being written to the memory. The third data are first data that have been read from the memory.

Exemplary embodiments of a memory system will be explained below in detail with reference to the accompanying drawings. The present invention is not limited to the following embodiments.

First Embodiment

Figure 1:
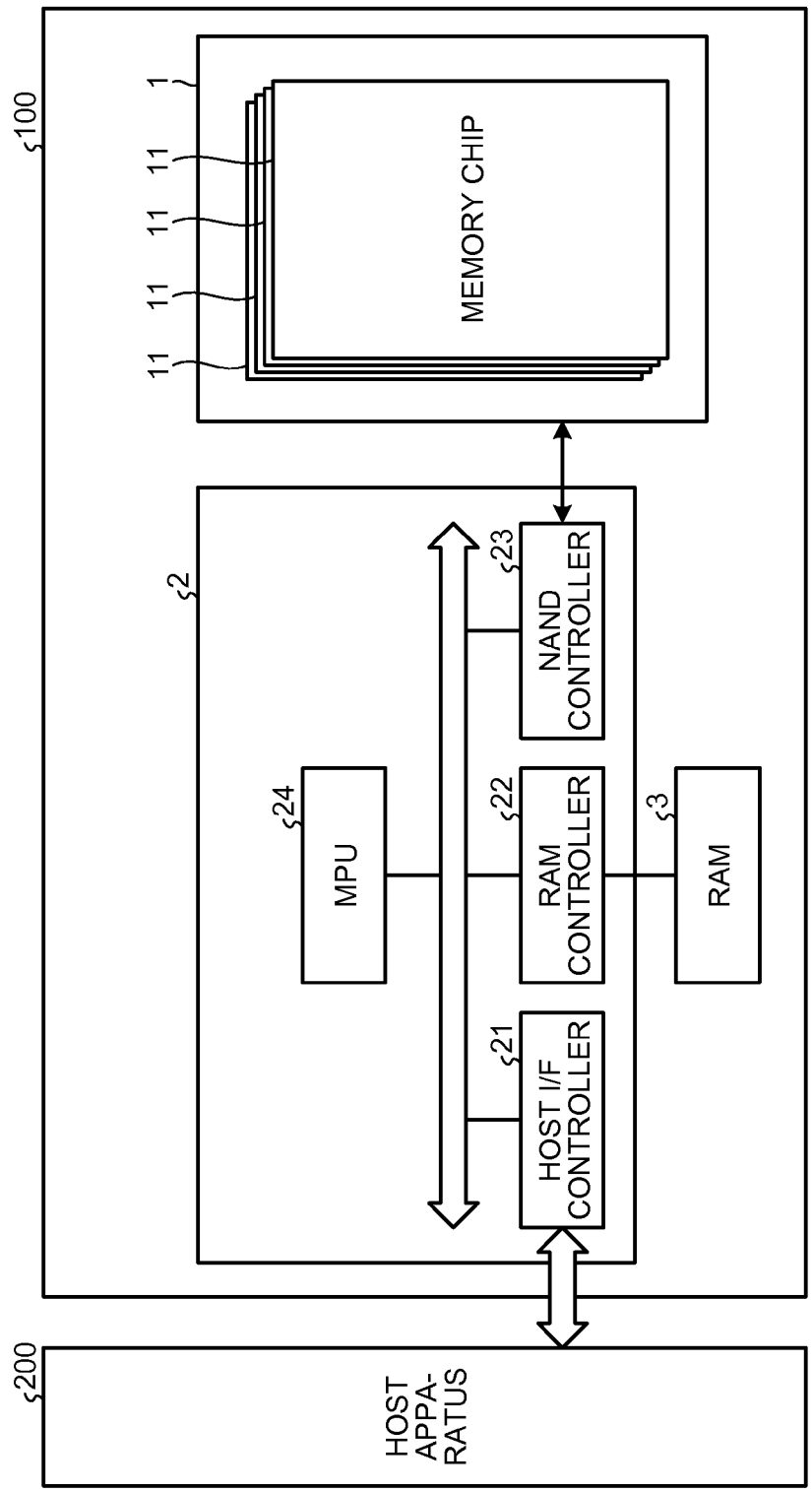
FIG. 1 is a view illustrating an example of configuration of a memory system according to an embodiment.

FIG. 1 is a view illustrating an example of configuration of a memory system according to a first embodiment. As illustrated in the figure, a memory system 100 is connected to a host apparatus 200, such as a personal computer, with a communication interface based on ATA (Advanced Technology Attachment) standard, SAS (Serial Attached SCSI) standard, PCI (Peripheral Components Interconnect) Express standard, and the like. The memory system 100 functions as an external storage device for the host apparatus 200.

The memory system 100 includes a NAND-type flash memory (NAND memory) 1, a transfer controller 2 configured to execute data transfer between the host apparatus 200 and the NAND memory 1, and a RAM 3 which is a volatile memory in which the transfer controller 2 temporarily stores transfer data. The data transmitted from the host apparatus 200 are stored to the RAM 3 under the control of the transfer controller 2, and thereafter, the data are read from the RAM 3 and written to the NAND memory 1.

The transfer controller 2 includes a host interface controller (host I/F controller) 21 executing control of a communication interface for communication with the host apparatus 200 and control of data transfer between the host apparatus 200 and the RAM 3, a RAM controller 22 controlling read/write of data to/from the RAM 3, a NAND controller 23 executing control of data transfer between the NAND memory 1 and the RAM 3, and an MPU 24 executing control of the entire transfer controller 2 on the basis of the firmware. The host I/F controller 21, the RAM controller 22, the NAND controller 23, and the MPU 24 are connected with each other via a bus.

The NAND memory 1 includes multiple memory chips 11 (four memory chips 11, in this case). The MPU 24 generates an instruction (read instruction/program instruction/erase instruction) for the NAND memory 1 on the basis of a command which the host I/F controller 21 receives from the host apparatus 200. The NAND controller 23 transmits an I/O signal and a control signal to each memory chip 11 on the basis of an instruction given by the MPU 24. The I/O signal includes the type of processing, an address, and data. The type of processing includes at least read, program, and erase. Examples of control signals include a CE (chip enable) signal, a WE (write enable) signal, an RE (read enable) signal, a CLE (command latch enable) signal, an ALE (address latch enable) signal, a WP (write protect) signal, and the like. Each memory chip 11 executes read/program/erase on the basis of an I/O signal and a control signal.

Figure 2:
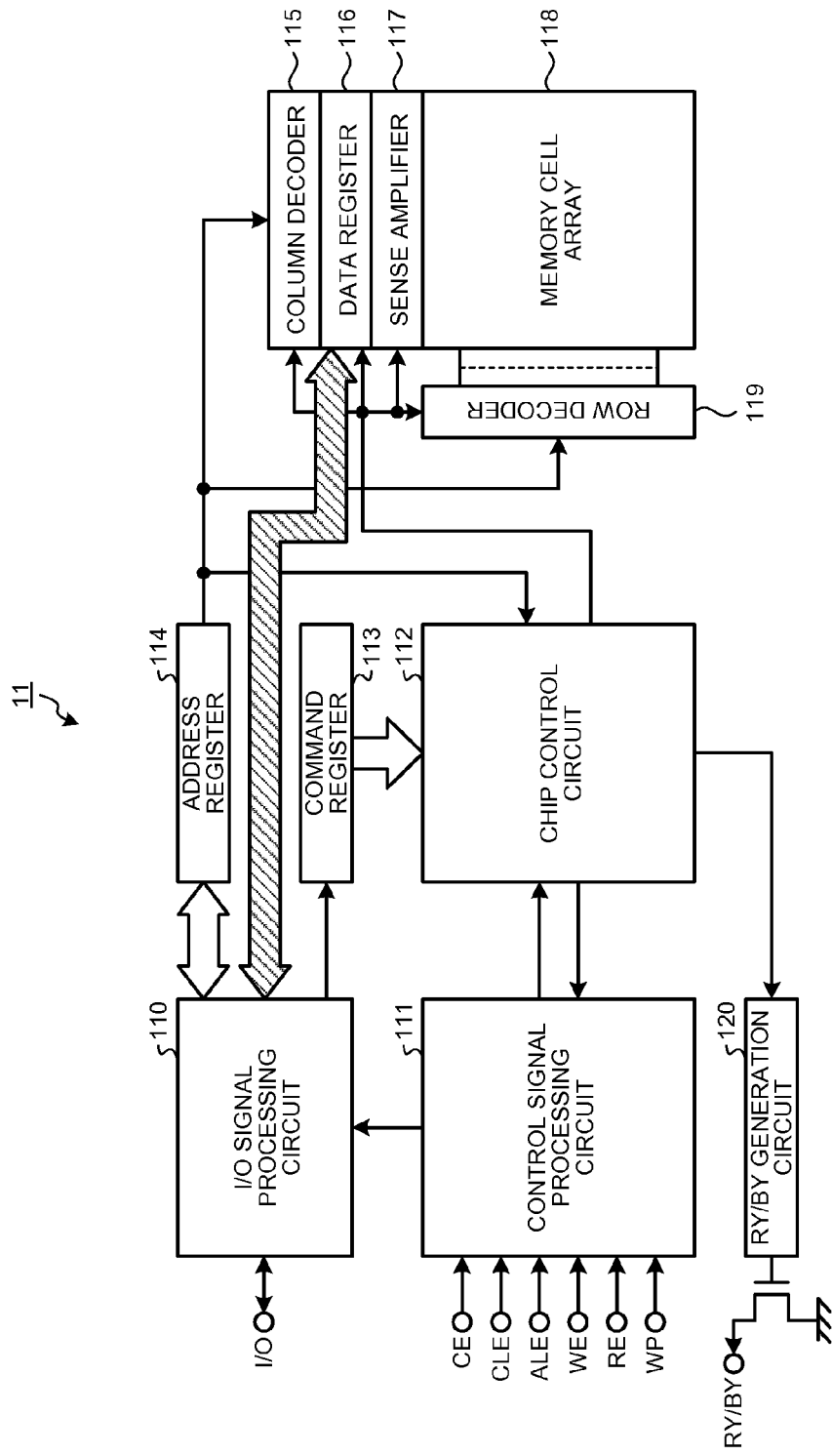
FIG. 2 is a view illustrating a configuration of a memory chip.

FIG. 2 is a view illustrating a configuration of each memory chip 11. The memory chip 11 includes an I/O signal processing circuit 110, a control signal processing circuit 111, a chip control circuit 112, a command register 113, an address register 114, a column decoder 115, a data register 116, a sense amplifier 117, a memory cell array 118, a row decoder 119, and an RY/BY generation circuit 120.

The chip control circuit 112 is a state transition circuit for changing the state on the basis of various kinds of control signal received via the control signal processing circuit 111, and controls operation of the entire memory chip 11. The RY/BY generation circuit 120 changes the state of the RY/BY signal line to a ready state (RY) and a busy state (BY) under the control of the chip control circuit 112.

The I/O signal processing circuit 110 is a buffer circuit for transmitting and receiving an I/O signal to/from the NAND controller 23. A command latched by the I/O signal processing circuit 110, an address designating an access destination, and data (write data) are respectively distributed and stored to the address register 114, the command register 113, and the data register 116.

The address stored in the address register 114 includes a chip address for identifying a memory chip 11, a row address, and a column address, which are arranged from the upper side. The chip address is ready by the chip control circuit 112, the row address is ready by the row decoder 119, and the column address is read by the column decoder 115.

The control signal processing circuit 111 receives input of a control signal. The control signal processing circuit 111 executes distributing process for distributing the I/O signal received by the I/O signal processing circuit 110 to the registers of the storage destinations on the basis of the received control signal. The control signal processing circuit 111 transfers the received control signal to the chip control circuit 112.

The memory cell array 118 includes a plurality of blocks. Each block is the unit of erasing.

Figure 3:
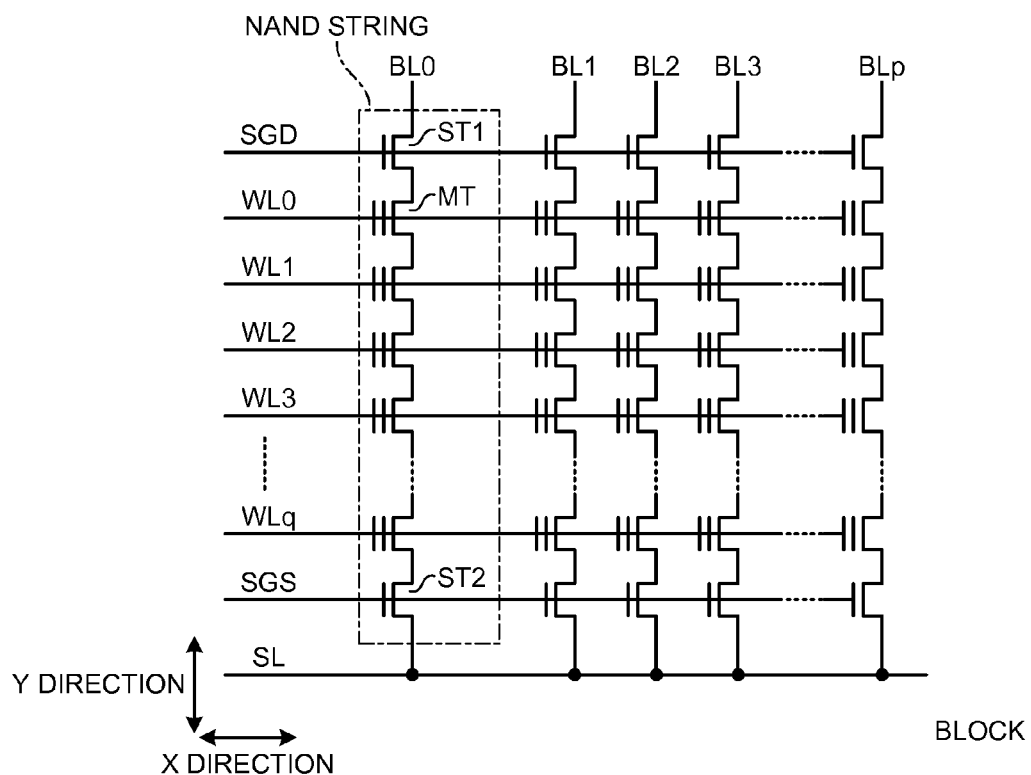
FIG. 3 is a circuit diagram illustrating an example of configuration of a single block included in a memory cell array.

FIG. 3 is a circuit diagram illustrating an example of configuration of a single block included in the memory cell array 118. As illustrated in the diagram, each block includes (m+1) NAND strings (m is an integer equal to or more than 0) arranged in order along an X direction. The drain of a selection transistor ST1 included in each of the (m+1) NAND strings is connected to bit lines BL0 to BLp, and the gate of each of the selection transistors ST1 is commonly connected to a selection gate line SGD. The source of each of selection transistors ST2 is commonly connected to a source line SL, and the gate of each of the selection transistors ST2 is commonly connected to a selection gate line SGS.

Each memory cell transistor MT includes an MOSFET (metal oxide semiconductor field effect transistor) having a stacked gate structure formed on a semiconductor substrate. The stacked gate structure includes an electrical charge accumulation layer (Floating Gate) formed on a semiconductor substrate with a tunnel oxidized film interposed therebetween and a control gate electrode formed on the electrical charge accumulation layer with a gate insulation film interposed therebetween. In the memory cell transistor MT, the threshold value voltage changes in accordance with the number of electrons accumulated in the Floating Gate, and data are stored in accordance with the difference in this threshold value voltage. More specifically, the memory cell transistor MT holds a quantity of an electrical charge in the Floating Gate in accordance with the data.

In each NAND string, the (n+1) memory cell transistors MT are arranged so that the electrical current paths thereof are connected in series between the source of the selection transistor ST1 and the drain of the selection transistor ST2. From the memory cell transistor MT located most closely to the drain side, the control gate electrodes are respectively connected to the word lines WL0 to WLq in order. Therefore, the drain of the memory cell transistor MT connected to the word line WL0 is connected to the source of the selection transistor ST1, and the source of the memory cell transistor MT connected to the word line WLq is connected to the drain of the selection transistor ST2.

The word lines WL0 to WLq are commonly connected to the control gate electrodes of the memory cell transistors MT among the NAND strings in the block. More specifically, the control gate electrodes of the memory cell transistors MT in the same row in the block are connected to the same word line WL. The (m+1) memory cell transistors MT connected to the same word line WL are treated as a page. Programming of data and reading of data are performed on each of these pages.

For example, according to a storage method for storing two bits in a single memory cell transistor MT, any one of four-value data "yx" defined by upper page data "x" and lower page data "y" can be held in a memory cell transistor MT. For example, data "11", "10", "00", and "01" are allocated to the four-value data "yx" in the order of the quantity of an electrical charge accumulated in the Floating Gate. The data "11" is an erased state. It should be noted that the order of the quantity of an electrical charge associated with the data are not limited to the above. Any method may be employed as long as it is a method in which the data are associated with the quantity of an electrical charge so that a hamming distance between adjacent data is 1.

The row decoder 119, the column decoder 115, and the sense amplifier 117 execute access to the memory cell array 118 on the basis of the control performed by the chip control circuit 112. More specifically, the row decoder 119 selects a word line corresponding to the read row address, thus activating the selected word line. The column decoder 115 selects and activates the bit line corresponding to the read column address. The sense amplifier 117 applies a voltage to the bit line selected by the column decoder 115, thus programming data stored in the data register 116 into a memory cell transistor MT located at a crossing point of the word line selected by the row decoder 119 and the bit line selected by the column decoder 115. More specifically, the sense amplifier 117 applies a high voltage programming pulse to the control gate electrode of the memory cell transistor MT via the word line WL until the threshold value voltage attains the target voltage according to the data.

Further, the sense amplifier 117 reads the data stored in the memory cell transistor MT via the bit line. During the read operation, the read voltage is applied to the word line WL in order to identify the data stored in the memory cell transistor ("11", "10", "00", and "01").

Figure 4:
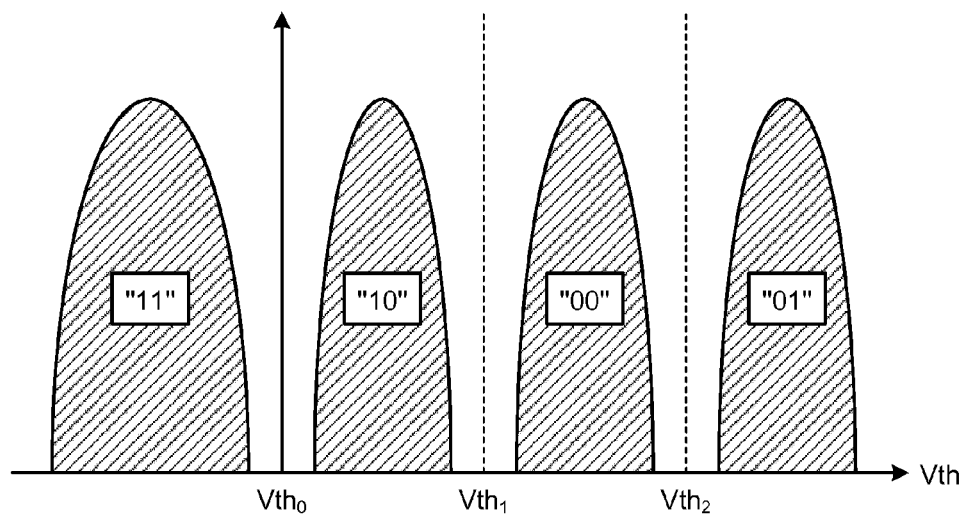
FIG. 4 is a view illustrating relationship between a distribution of the quantity of an electrical charge and a read voltage.

FIG. 4 is a view illustrating relationship of the distribution of the quantity of an electrical charge and the read voltage. The horizontal axis represents the threshold value voltage according to the quantity of an electrical charge. As illustrated in the diagram, in reality, the quantity of an electrical charge allocated to each piece of data is distributed over a range of a certain width. Which range the quantity of an electrical charge held in the memory cell transistor MT belongs to is determined on the basis of comparison between the threshold value voltage and the read voltage which has been set in each range. For example, the sense amplifier 117 determines whether the upper page data are "1" or "0" based on whether the threshold value voltage of the memory cell transistor MT exists between a read voltage Vth0 and a read voltage Vth2. In a case where the threshold value voltage of the memory cell transistor MT is determined to exist between the read voltage Vth0 and the read voltage Vth2, the sense amplifier 117 determines that the upper page data is "0". In a case where the threshold value voltage of the memory cell transistor MT does not exist between the read voltage Vth0 and the read voltage Vth2, the sense amplifier 117 determines that the upper page data is "1". The sense amplifier 117 determines whether the lower page data is "1" or "0" based on whether the threshold value voltage of the memory cell transistor MT is more than or less than the read voltage Vth1. When the threshold value voltage of the memory cell transistor MT is more than the read voltage Vth1, the sense amplifier 117 determines that the lower page data is "0". When the threshold value voltage of the memory cell transistor MT is less than the read voltage Vth1, the sense amplifier 117 determines that the lower page data is "1".

It should be noted that the read voltages Vth0 to Vth2 are stored to any one of the storage units in the memory chip 11. The memory chip 11 stores the initial value of the read voltages Vth0 to Vth2 in advance. In the initial state, the sense amplifier 117 uses the initial value. The range of the quantity of an electrical charge allocated to the data changes over time and on each access. The transfer controller 2 can shift the read voltage according to the change. When the setting values of the read voltages Vth0 to Vth2 are sent from the transfer controller 2, the sense amplifier 117 uses the received setting values.

The sense amplifier 117 stores the data, which have been read, to the data register 116. The data stored in the data register 116 are sent via the data line to the I/O signal processing circuit 110, and are transferred from the I/O signal processing circuit 110 to the transfer controller 2.

Figure 5:
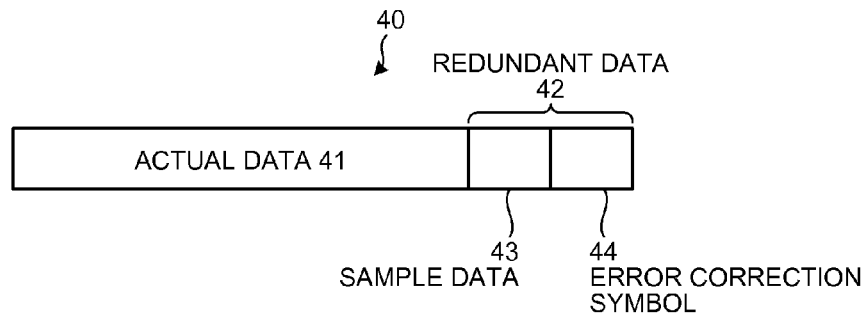
FIG. 5 is a view illustrating an example of configuration of page data.

FIG. 5 is a view illustrating an example of configuration of data (page data) stored in a single word line. The page data 40 includes actual data 41 and redundant data 42. The actual data 41 include, for example, data which are sent from the host apparatus 200. The actual data 41 may include a firmware used by the memory system 100 or management information. In the description herein, the actual data 41 are data sent from the host apparatus 200. The redundant data 42 includes sample data 43 and an error correction symbol 44. The error correction symbol 44 is a piece of data for error correction of the actual data 41.

The sample data 43 are data used to determine the read voltages Vth0 to Vth2. The sample data 43 are in a size of multiple bits, and the size of the sample data 43 is already known. The number of "1"s included in the sample data 43 is already known. In each word line, the sample data 43 are stored. The memory system 100 can set the read voltages Vth0 to Vth2 on the basis of the sample data 43 for each word line.

Figure 6:
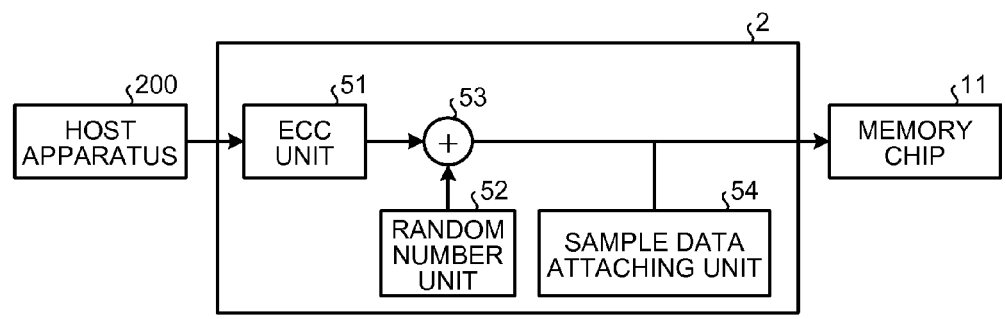
FIG. 6 is a view illustrating an example of functional configuration of a transfer controller for programming.

FIG. 6 is a view illustrating an example of functional configuration of programming provided in the transfer controller 2. The transfer controller 2 includes an ECC unit 51, a random number unit 52, an adder 53, and a sample data attaching unit 54, which serve as a functional configuration for programming. Some or all of the ECC unit 51, the random number unit 52, the adder 53, and the sample data attaching unit 54 may be achieved with software or may be achieved with hardware. To achieve components with software is causing the MPU 24 to achieve the functions of the components on the basis of the firmware. For example, the ECC unit 51, the random number unit 52, the adder 53, and the sample data attaching unit 54 are embodied as hardware in the NAND controller 23.

The ECC unit 51 calculates the error correction symbol 44 of the actual data 41 on the basis of the actual data 41 sent from the host apparatus 200. Then, the ECC unit 51 adds the calculated error correction symbol 44 to the actual data 41. The random number unit 52 and the adder 53 cooperate with each other to randomize the actual data 41. More specifically, the random number unit 52 generates a random number. The adder 53 calculates EXOR of the actual data 41 having the error correction symbol 44 added thereto and the random number generated by the random number unit 52. In the description herein, the actual data 41 and the error correction symbol 44 are randomized. Alternatively, only the actual data 41 may be randomized. The sample data attaching unit 54 adds the sample data 43 to the data which are output by the adder 53. The page data 40, which have been completed upon the addition of the sample data 43, are sent to the memory chip 11.

Figure 7:
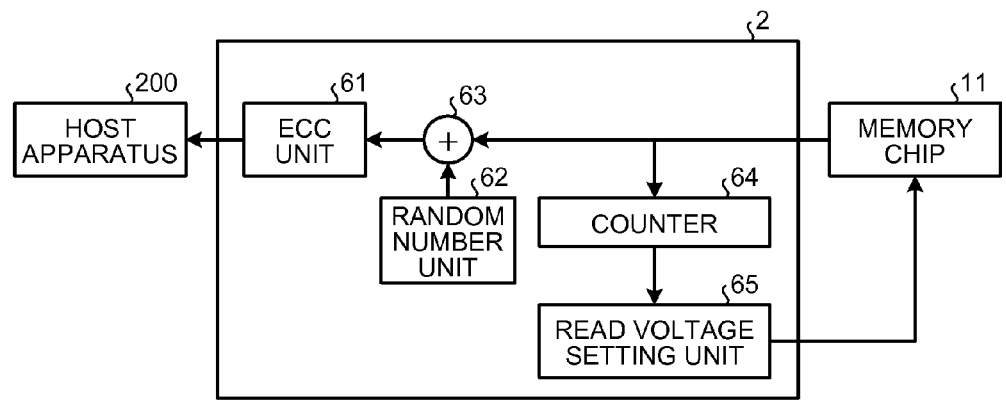
FIG. 7 is a view illustrating an example of functional configuration of a transfer controller for reading.

FIG. 7 is a view illustrating an example of functional configuration of reading provided in the transfer controller 2. The transfer controller 2 includes an ECC unit 61, a random number unit 62, an adder 63, a counter 64, and a read voltage setting unit 65, which serve as a functional configuration for programming. Some or all of the ECC unit 61, the random number unit 62, the adder 63, the counter 64, and the read voltage setting unit 65 may be achieved with software or may be achieved with hardware. For example, the ECC unit 61, the random number unit 62, the adder 63, and the counter 64 are embodied as hardware in the NAND controller 23. The read voltage setting unit 65 is achieved by causing the MPU 24 to execute the firmware.

In the page data 40 which are read from the memory chip 11, the actual data 41 and the error correction symbol 44 are sent to the adder 63, and the sample data 43 are sent to the counter 64. The random number unit 62 and the adder 63 cooperate with each other to decode the randomized the actual data 41 back to the state prior to the randomization. More specifically, the random number unit 62 generates the same random number as the random number generated by the random number unit 52 during writing. The adder 63 calculates EXOR of the actual data 41 having the error correction symbol 44 added thereto and the random number generated by the random number unit 52. Accordingly, the error correction symbol 44 and the actual data 41 are decoded back to the state prior to the randomization. The ECC unit 61 executes error correction of the actual data 41 on the basis of the error correction symbol 44. When the error correction is successful, the error-corrected actual data 41 are sent to the host apparatus 200.

The counter 64 counts the number of a predetermined value included in the sample data 43. In this case, for example, the counter 64 counts the number of "1"s included in the sample data 43. When the ECC unit 61 fails the error correction, the read voltage setting unit 65 derives the setting value of the read voltage on the basis of the configuration of the sample data 43 when writing and the count value counted by the counter 64. Then, the read voltage setting unit 65 transmits the derived setting value to the memory chip 11. The memory chip 11 uses the setting value to execute reading of the sample data 43 again.

Figure 8:
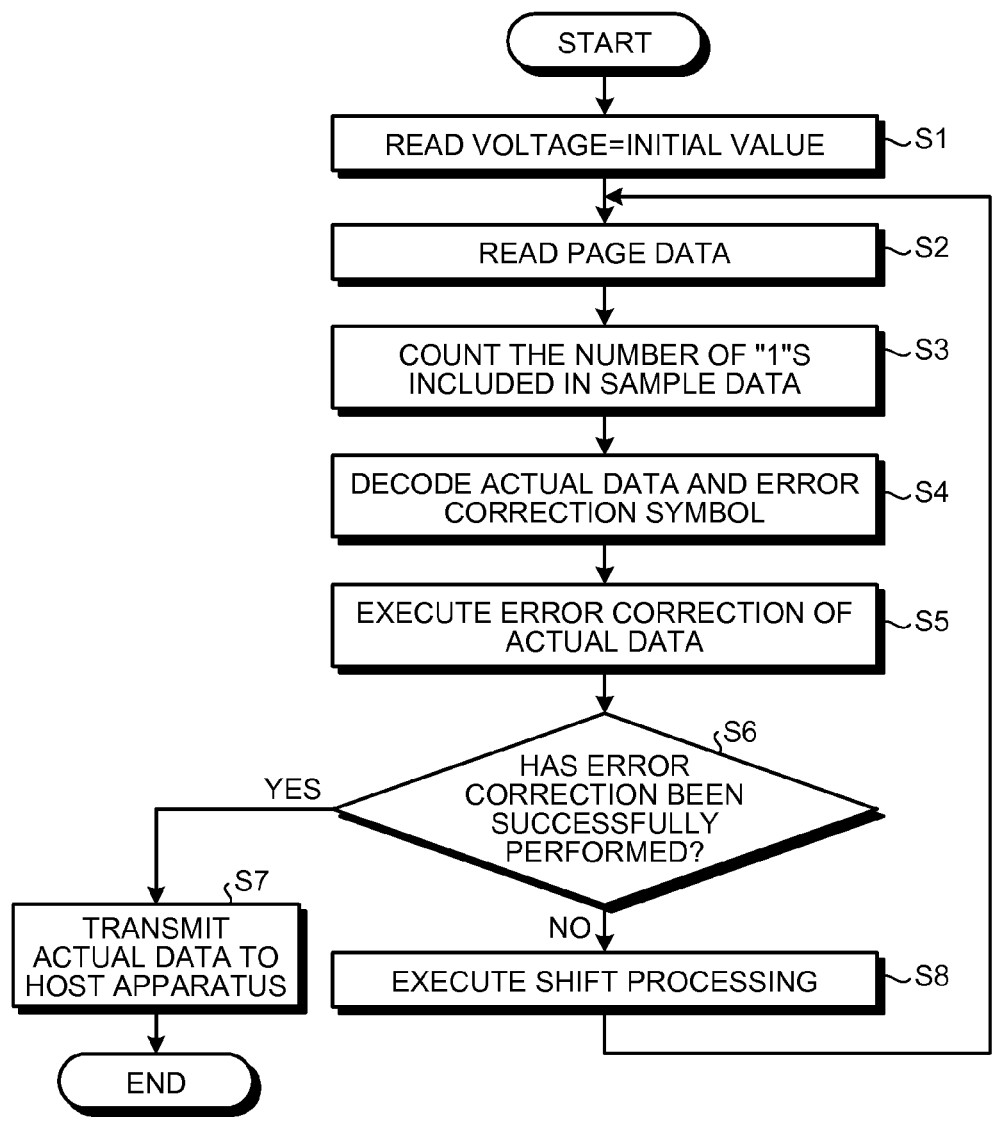
FIG. 8 is a flowchart for explaining operation of a memory system when reading.

FIG. 8 is a flowchart for explaining operation of the memory system 100 when reading. Each memory chip 11 is in such state that the initial value can be used as the read voltage (S1). The memory chip 11, which is the target of reading, reads the page data 40 (S2). In this case, the memory chip 11, which is the target of reading, executes reading using the initial value. The counter 64 receives the sample data 43 included in the page data 40 sent from the memory chip 11, and counts the number of "1"s included in the sample data 43 (S3). The adder 63 decodes the actual data 41 and the error correction symbol 44 back to the state prior to the randomization (S4). The ECC unit 61 executes the error correction of the actual data 41 on the basis of the error correction symbol 44 (S5). When the ECC unit 61 successfully performs the error correction (Yes in S6), the actual data 41 are sent to the host apparatus 200 (S7), and the operation is completed.

When the ECC unit 61 fails the error correction (No in S6), the read voltage setting unit 65 executes shift processing for shifting the read voltage on the basis of the count value counted by the counter 64 (S8). After the processing in S8, the memory chip 11 uses the shifted read voltage to execute the processing in S2 again.

Figure 9:
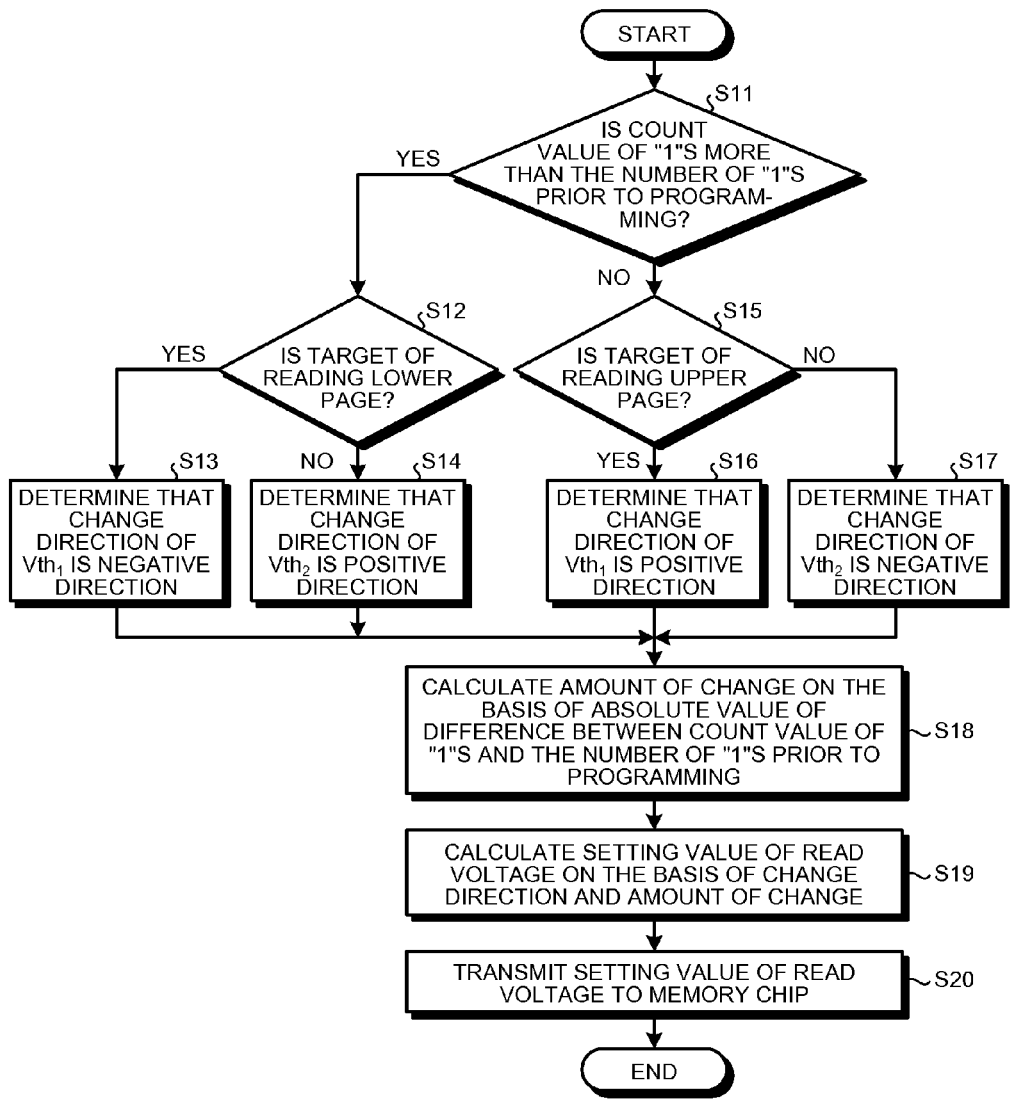
FIG. 9 is a flowchart for explaining an example of shift processing.

FIG. 9 is a flowchart for explaining an example of shift processing. The read voltage setting unit 65 determines whether the count value of the number of "1"s is more than the number of "1"s included in the sample data 43 prior to the programming (S11).

In a case where the count value of the number of "1"s is determined to be more than the number of "1"s prior to the programming (Yes in S11), the read voltage setting unit 65 determines whether the target of reading is a lower page or not (S12). In a case where the target of reading is a lower page (Yes in S12), the read voltage setting unit 65 determines that the change direction of Vth1 is a negative direction (S13). In a case where the target of reading is not a lower page (No in S12), more specifically, when the target of reading is an upper page, the read voltage setting unit 65 determines that the change direction of Vth2 is a positive direction (S14). In this case, the value of Vth0 is a zero value, and the value of Vth0 does not change as the time elapses or upon an access.

When the count value of the number of "1"s is determined to be less than the number of "1"s prior to the programming (No in S11), the read voltage setting unit 65 determines whether the target of reading is a lower page (S15). When the target of reading is determined to be a lower page (Yes in S15), the read voltage setting unit 65 determines that the change direction of Vth1 is the positive direction (S16). When the target of reading is not a lower page (No in S15), and more specifically, when the target of reading is an upper page, the read voltage setting unit 65 determines that the change direction of Vth2 is the negative direction (S17).

After the processing in S13, S14, S16, or S17, the read voltage setting unit 65 derives the amount of change (S18). The read voltage setting unit 65 determines the amount of change in the read voltage in accordance with the absolute value of the difference between the count value of the number of "1"s and the number of "1"s when writing. The read voltage setting unit 65 determines the amount of change so that the amount of change becomes larger as the absolute value of the difference is larger. The read voltage setting unit 65 may store, in advance, a table or a function indicating correlation relationship between the absolute value of the difference and the amount of change, and may calculate the amount of change using the table or the function. The read voltage setting unit 65 may be configured to store, in advance, the table or the function for each of Vth1 and Vth2.

After the processing in S18, the read voltage setting unit 65 calculates the setting value of the read voltage on the basis of the change direction and the amount of change (S19). The read voltage setting unit 65 transmits the setting value of the calculated read voltage to the memory chip 11 (S20), and completes the shift processing.

As described above, according to the first embodiment, the read voltage setting unit 65 changes the read voltage used by the sense amplifier 117 to a value according to the number of values different between the sample data 43 prior to the programming and the sample data read from the memory chip 11. The transfer controller 2 can change the read voltage to an appropriate value by once performing reading of the sample data 43. When the read voltage is an appropriate value, this means that at least data which can be error-corrected are read by using the value as a read voltage.

The read voltage setting unit 65 changes the read voltage more greatly as there are more different values between the sample data 43 prior to the programming and the sample data 43 read from the memory chip 11. Accordingly, the transfer controller 2 can change the read voltage to an appropriate value by just reading the sample data 43 only once.

The read voltage setting unit 65 determines whether to increase or decrease the threshold value voltage on the basis of whether the number of "1"s included in the sample data 43 read from the memory chip 11 is more than the number of "1"s included in the sample data 43 prior to the programming. Therefore, the transfer controller 2 can change the read voltage to an appropriate value by just reading the sample data 43 only once. It should be noted that the read voltage setting unit 65 may determine whether to increase or decrease the threshold value voltage on the basis of whether the number of "0"s included in the sample data 43 read from the memory chip 11 is more than or less than the number of "0"s included in the sample data 43 prior to the programming. In such case, whether the threshold value voltage is increased or decreased is a result opposite to the determination result based on the number of "1"s.

For example, when the relationship between the read voltage and the distribution of the quantity of an electrical charge is defined as illustrated in FIG. 4, and when the target of reading is a lower page, each component operates as follows. More specifically, when the threshold value voltage is less than the read voltage Vth1, the sense amplifier 117 determines that the memory cell transistor MT stores "1", and when the threshold value voltage is more than the read voltage Vth1, the sense amplifier 117 determines that the memory cell transistor MT stores "0". When the number of "1"s included in the sample data 43 read from the memory chip 11 is more than the number of "1"s included in the sample data 43 prior to the programming, the read voltage setting unit 65 changes the read voltage Vth1 to a smaller value. When the number of "1"s included in the sample data 43 read from the memory chip 11 is less than the number of "1"s included in the sample data 43 prior to the programming, the read voltage setting unit 65 changes the read voltage Vth1 to a larger value. Consequently, when the distribution of the quantity of an electrical charge moves to a negative side with respect to the distribution when programming, the read voltage Vth1 is changed to a smaller value, and therefore, the transfer controller 2 can correctly read the data programmed in the lower page. When the distribution of the quantity of an electrical charge moves to a positive side with respect to the distribution when programming, the read voltage Vth1 is changed to a larger value, and therefore, the transfer controller 2 can correctly read the data programmed in the lower page.

When the relationship between the read voltage and the distribution of the quantity of an electrical charge is defined as illustrated in FIG. 4, and when the target of reading is an upper page, each component operates as follows. More specifically, when the threshold value voltage is less than the read voltage Vth0 or the threshold value voltage is more than the read voltage Vth2, the sense amplifier 117 determines that the memory cell transistor MT stores "1". When the threshold value voltage is more than the read voltage Vth0 and the threshold value voltage is less than the read voltage Vth2, the sense amplifier 117 determines that the memory cell transistor MT stores "0". When the number of "1"s included in the sample data 43 read from the memory chip 11 is more than the number of "1"s included in the sample data 43 prior to the programming, the read voltage setting unit 65 changes the read voltage Vth2 to a larger value. When the number of "1"s included in the sample data 43 read from the memory chip 11 is less than the number of "1"s included in the sample data 43 prior to the programming, the read voltage setting unit 65 changes the read voltage Vth2 to a smaller value. Consequently, when the distribution of the quantity of an electrical charge moves to a negative side with respect to the distribution when programming, the read voltage Vth2 is changed to a smaller value, and therefore, the transfer controller 2 can correctly read the data programmed in the upper page. When the distribution of the quantity of an electrical charge moves to a positive side with respect to the distribution when programming, the read voltage Vth2 is changed to a larger value, and therefore, the transfer controller 2 can correctly read the data programmed in the upper page.

In the description herein, only the read voltage Vth2 is changed with regard to the upper page. Alternatively, the read voltage Vth2 as well as the read voltage Vth0 may be changed. The pattern of change in the read voltage Vth2 and the pattern of change in the read voltage Vth0 are related to each other, and the read voltage setting unit 65 stores the relationship therebetween in advance. When the read voltage Vth2 is changed, the read voltage setting unit 65 calculates the change direction and the amount of change of the read voltage Vth0 in accordance with the change direction and the amount of change of the read voltage Vth2.

In the above description, the change direction of each read voltage is determined on the basis of the sign of the difference between the number of "1"s included in the sample data 43 read from the memory chip 11 and the number of "1"s included in the sample data 43 prior to the programming, and the amount of change of each read voltage is determined on the basis of the absolute value of the difference. The change direction and the amount of change of each read voltage may be stored in advance to the read voltage setting unit 65 in association with the difference having a sign.

In the above description, a storage method for storing two bits in a single memory cell transistor MT is employed. The first embodiment can also be applied to a case where a storage method for storing three or more bits in a single memory cell transistor MT is employed. In the case of the storage method for storing three bits in a single memory cell transistor MT, a single memory cell transistor MT stores eight-value data "zyx" defined by upper page data "x", middle page data "y", and lower page data "z". The eight-value data are determined on the basis of comparison between some of seven read voltages and a threshold value voltage. The read voltage setting unit 65 identifies the read voltage of the change target on the basis of whether the target of reading is an upper page, a middle page, or a lower page. Then, the read voltage setting unit 65 determines the change direction of the identified read voltage on the basis of the sign of the difference between the number of "1"s included in the sample data 43 read from the memory chip 11 and the number of "1"s included in the sample data 43 prior to the programming. The read voltage setting unit 65 subsequently determines the amount of change of the identified read voltage on the basis of the absolute value of the difference. The read voltage setting unit 65 may store the change direction and the amount of change of each read voltage in advance in association with the difference having the sign.

The memory cell array 118 has multiple pages. Each page is the unit of programming and reading. Then the sample data 43 are stored in each page as the redundant data 42. More specifically, the transfer controller 2 reads the actual data 41 and the sample data 43 in a single read process. Therefore, when error correction of the actual data 41 fails, the transfer controller 2 can change the read voltage to an appropriate value without reading the sample data 43 again.

In the above description, the actual data 41 are randomized and written to the memory cell array 118. Therefore, in the actual data 41 before the programming to the memory cell array 118 but after the randomizing, the number of "1"s and the number of "0"s are substantially the same. Taking advantage of this fact, the randomized actual data 41 can be used for determining the change direction and the amount of change of the read voltage. More specifically, the read voltage setting unit 65 determines the sign of the read voltage on the basis of whether the number of "1"s included in the actual data 41 after the reading is more than the number of half of the number of bits of the actual data 41. The read voltage setting unit 65 determines the amount of change of the read voltage based on the absolute value of the difference between the number of "1"s included in the actual data 41 after the reading and the number of half of the number of bits of the actual data 41. The memory system 100 is configured as described above, and therefore, it is not necessary to program the sample data 43 to the memory cell array 118.

In the description above, the sample data 43 are programmed for each page. Alternatively, the sample data 43 may be programmed in a unit different from each page. For example, the sample data 43 may be programmed for each block. For example, a single sample data 43 may be programmed for each block. In this case, when error correction of the actual data 41 fails, the transfer controller 2 requests the memory chip 11 to perform new reading process for reading the sample data 43.

In the description above, the actual data 41 are randomized after the error correction symbol 44 is calculated. Alternatively, for the actual data 41, the error correction symbol 44 may be calculated after the randomization.

In the description above, the read voltage setting unit 65 transmits the read voltage to the memory chip 11. The read voltage setting unit 65 may transmit the amount of change and the change direction of the read voltage to the memory chip 11. In this case, the memory chip 11 calculates the read voltage used for a subsequent reading process, on the basis of the amount of change and change direction received and the read voltage used for the last reading.

A part or the entire of the functional configuration for reading and a part or the entire of the functional configuration for programming may be implemented on a difference chip, or on the same chip. For example, the adder 53 and the adder 63 may be common or may not be common. The random number unit 52 and the random number unit 62 may be common or may not be common.

Second Embodiment

Figure 10:
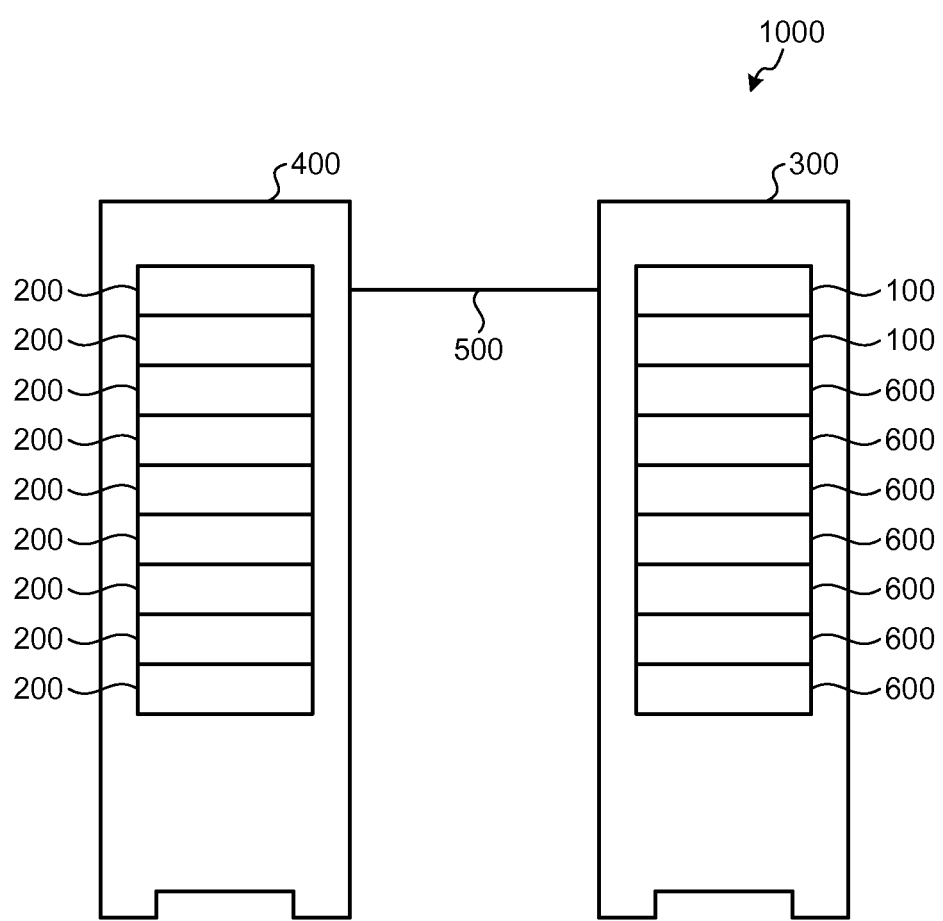
FIG. 10 is a view illustrating an example of implementation of a memory system.

FIG. 10 is a view illustrating an example of implementation of a memory system 100. The memory system 100 is, for example, implemented in a server system 1000. In the server system 1000, a disk array 300 and a rack mount server 400 are connected by a communication interface 500. Any given standard may be employed as a standard of the communication interface 500. The rack mount server 400 is configured such that one or more host apparatus 200 are mounted to a server rack. Each host apparatus 200 mounted to the rack mount server 400 can access the disk array 300 via the communication interface 500.

The disk array 300 is configured such that one or more memory systems 100 and one or more hard disk units 600 are mounted to a server rack. In the disk array 300, for example, one or more memory systems 100 are used as caches for one or more hard disk units. In the disk array 300, storage controller units establishing RAID may be mounted to one or more hard disk units 600. For example, the storage controller unit is connected to one or more memory systems 100 and one or more hard disk units 600 via a backplane (not illustrated) provided in the disk array 300. The NAND memory 1 and the transfer controller 2 may be accommodated in different housings. For example, each housing is mounted to the disk array 300 as a different unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a memory that includes a memory cell array including a plurality of memory cells, each of which holds an electrical charge, and includes a peripheral circuit configured to read a value from each memory cell by comparing a quantity of an electrical charge held in the memory cell with a determination threshold, the memory storing first data in the memory cell array, the first data including a plurality of values; and
a setting unit configured to count the number of values which are different in second data and third data among the plurality of values and change the determination threshold according to the number of the values, the second data being first data before being written to the memory, and the third data being first data that have been read from the memory.

2. The memory system according to claim 1, wherein the setting unit increases the amount of change of the determination threshold as the number of the values is larger.

3. The memory system according to claim 2, wherein
the peripheral circuit determines whether a quantity of an electrical charge held in each memory cell indicates a first value or indicates a second value, and
the setting unit determines whether to increase or decrease the determination threshold based on whether the number of first values included in the third data is more than or less than the number of first values included in the second data.

4. The memory system according to claim 3, wherein in a case where the quantity of an electrical charge is less than the determination threshold, the peripheral circuit determines that the quantity of an electrical charge indicates the first value, and in a case where the quantity of an electrical charge is more than the determination threshold, the peripheral circuit determines that the quantity of an electrical charge indicates the second value.

5. The memory system according to claim 4, wherein
in a case where the number of first values included in the third data is more than the number of first values included in the second data, the setting unit decreases the determination threshold, and
in a case where the number of first values included in the third data is less than the number of first values included in the second data, the setting unit increases the determination threshold.

6. The memory system according to claim 3, wherein
the determination threshold includes a first determination threshold, a second determination threshold larger than the first determination threshold, and a third determination threshold larger than the second determination threshold,
in a case where the quantity of an electrical charge is less than the first determination threshold or the quantity of an electrical charge is more than the third determination threshold, the peripheral circuit determines that the quantity of an electrical charge indicates the first value, and
in a case where the quantity of an electrical charge is larger than the first determination threshold and the quantity of an electrical charge is less than the third determination threshold, the peripheral circuit determines that the quantity of an electrical charge indicates the second value.

7. The memory system according to claim 6, wherein
in a case where the number of first values included in the third data is more than the number of first values included in the second data, the setting unit increases at least the third determination threshold, and
in a case where the number of first values included in the third data is less than the number of first values included in the second data, the setting unit decreases at least the third determination threshold.

8. The memory system according to claim 1, wherein
the peripheral circuit determines whether the quantity of an electrical charge held in each memory cell indicates a first value or a second value, and
the setting unit stores, in advance, a correlation between the determination threshold and a difference between the number of first values included in the third data and the number of first values included in the second data, and changes the determination threshold to be used by the peripheral circuit on the basis of the correlation.

9. The memory system according to claim 1, wherein
the memory cell array includes a plurality of pages, each of which is a unit of writing and reading, and
the first data are redundant data and stored in each page.

10. The memory system according to claim 9, wherein
each page stores not only the first data but also fourth data,
the memory system further comprises an ECC unit configured to execute error correction of the fourth data, and
in a case where the ECC unit fails the error correction of the fourth data, the setting unit changes the determination threshold.

11. A memory system comprising:
a memory that includes a memory cell array including a plurality of memory cells, each of which holds a quantity of an electrical charge in accordance with a value, and includes a peripheral circuit configured to read a value in accordance with the quantity of an electrical charge held in each memory cell by comparing the quantity of an electrical charge held in each memory cell with a determination threshold; and
a writing unit configured to write redundant data for determining the determination threshold to the memory cell array.

12. The memory system according to claim 11, wherein
the memory cell array includes a plurality of pages, each of which is a unit of writing and reading, and
the writing unit writes the redundant data to each page.

13. A memory system comprising:
a memory that includes a peripheral circuit configured to read a value from each memory cell by comparing a quantity of an electrical charge held in each memory cell with a determination threshold, the memory storing data including a plurality of values; and
a setting unit configured to count the number of values of the plurality of values which are different before writing of the data and after reading of the data among the plurality of values and change the determination threshold according to the number of the values.

* * * * *